United States Patent
Kim et al.

(10) Patent No.: US 6,806,779 B1
(45) Date of Patent: Oct. 19, 2004

(54) FREQUENCY SYNTHESIZER WITH ON-CHIP INDUCTOR

(75) Inventors: Beomsup Kim, Cupertino, CA (US); Cormac S. Conroy, Sunnyvale, CA (US)

(73) Assignee: Berkana Wireless, Inc., Campbell, CA (US)

( * ) Notice: Subject to any disclaimer, the term of this patent is extended or adjusted under 35 U.S.C. 154(b) by 0 days.

(21) Appl. No.: 10/325,478

(22) Filed: Dec. 20, 2002

(51) Int. Cl.[7] .................................................. H03L 7/00
(52) U.S. Cl. ................ 331/16; 331/117 FE; 331/177 R
(58) Field of Search ............................ 331/16, 117 FE, 331/177 R, 36 C, 181; 257/531; 327/310, 112

(56) References Cited

U.S. PATENT DOCUMENTS

| | | | |
|---|---|---|---|
| 5,986,483 A | * | 11/1999 | Yu et al. ..................... 327/107 |
| 6,085,075 A | * | 7/2000 | Van Bezooijen ............ 455/260 |
| 6,094,569 A | * | 7/2000 | Wang ......................... 455/313 |
| 6,268,777 B1 | * | 7/2001 | Welch .................. 331/117 FE |
| 6,608,361 B2 | * | 8/2003 | Chang et al. ................ 257/499 |
| 2003/0232610 A1 | * | 12/2003 | Lin et al. ..................... 455/258 |

* cited by examiner

Primary Examiner—Robert Pascal
Assistant Examiner—Joseph Chang
(74) Attorney, Agent, or Firm—Van Pelt & Yi LLP (57) ABSTRACT

A system and method are disclosed for generating a synthesized signal. A frequency synthesizer is used. The frequency synthesizer includes an input interface configured to receive an input signal having a reference frequency; a phase locked loop (PLL) coupled to the input interface, having a fractional N configuration and comprises a voltage controlled oscillator; wherein the voltage controlled oscillator is configured to generate the synthesized signal; and the voltage controlled oscillator includes an on-chip inductor.

23 Claims, 6 Drawing Sheets

FREQUENCY SYNTHESIZER WITH ON-CHIP INDUCTOR

CROSS REFERENCE TO RELATED APPLICATIONS

This application is related to co-pending U.S. patent application Ser. No. 10/003,729, by Kim entitled "VOLTAGE CONTROLLED OSCILLATOR" filed Nov. 14, 2001, which is incorporated herein by reference for all purposes; and co-pending U.S. patent application Ser. No. 10/004,521 by Kim entitled "PHASE SYNCHRONOUS MULTIPLE LC TANK OSCILLATOR" filed Nov. 14, 2001, which is incorporated herein by reference for all purposes; and co-pending U.S. patent application Ser. No. 10/101,560, by Kim, et al entitled "SYNCHRONOUSLY COUPLED OSCILLATOR" filed Mar. 18, 2002, which is incorporated herein by reference for all purposes; and co-pending U.S. patent application Ser. No. 10/227,632, by Baringer entitled "DYNAMIC FREQUENCY SYNTHESIZER CONFIGURATION" filed Aug. 22, 2002, which is incorporated herein by reference for all purposes.

FIELD OF THE INVENTION

The present invention relates generally to frequency synthesizers. More specifically, a frequency synthesizer design with one or more on-chip inductors is disclosed.

BACKGROUND OF THE INVENTION

Frequency synthesizers are commonly used in communications systems, as well as other applications. The oscillators of the frequency synthesizers are often implemented as LC tank oscillators, which include inductors and capacitors arranged to oscillate by exchanging current or voltage between inductors and capacitors with a finite frequency.

Ideally, an oscillator should have no loss and should be capable of oscillating at the same frequency forever. In most cases, however, the inductor in an LC tank oscillator is non-ideal and has some resistance that causes energy loss and instability in oscillation. The stability of the oscillation, as measured by the quality factor, Q, is proportional to the energy stored in the LC tank and is inversely proportional to the energy dissipated in the resistor per oscillation cycle. As the resistance of the inductor increases, Q decreases and the oscillator introduces more instability to the system. The phase noise added to the system also increases. Applications such as the frequency synthesizers used in cellular telephones require low phase noise, and hence high Q oscillators are suitable for these applications. The frequency synthesizers used in these applications also need to be highly tunable to meet the demands of the cellular telephony standards.

While it is desirable to integrate the inductor onto the same chip as the frequency synthesizer, attempts to build on-chip inductor using conventional deposition techniques have mostly resulted in low Q oscillators due to the resistance of the material. Certain other techniques, such as constructing the inductor using microelectricalmechanical systems (MEMS) technology, can be used to produce integrated oscillators with good Q values but tend to be expensive and hard to mass-produce. Thus, many of the systems that require high Q oscillators leave the inductor off-chip.

Figure 1:
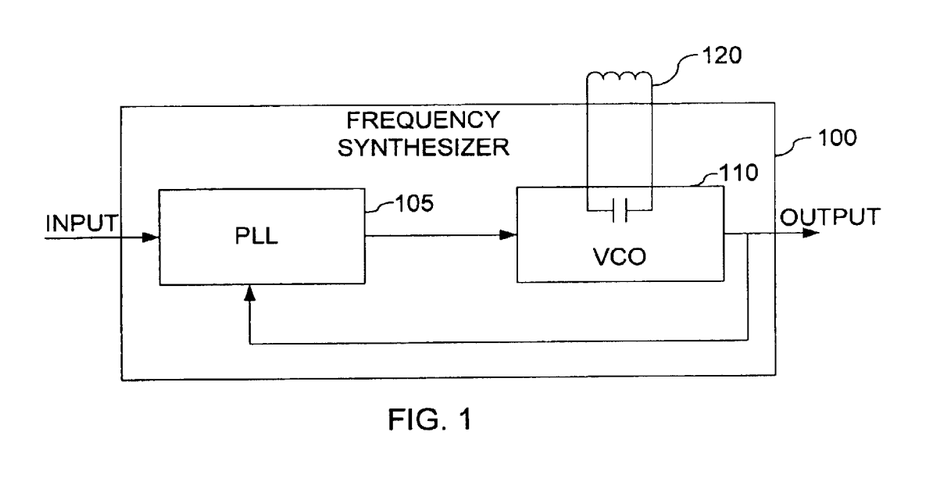
FIG. 1 is a block diagram illustrating a frequency synthesizer with an off-chip inductor.

FIG. 1 is a block diagram illustrating a frequency synthesizer with an off-chip inductor. The input of frequency synthesizer 100 is a signal with a reference frequency. The frequency synthesizer includes a Phase locked loop (PLL) 105 and a voltage controlled oscillator (VCO) 10. For purpose of clarity, the rest of details of the frequency synthesizer, PLL and VCO are not shown. The PLL is configured to apply a voltage to the VCO, which then outputs a signal with a desired frequency. The signal output by the VCO is the output of the frequency synthesizer. VCO 110 has an LC tank oscillator with inductor 120 that is external to the frequency synthesizer chip. The inductor may be an external component bonded to the chip via external pins or bond wires, or a copper trace deposited on a printed circuit board. There are several disadvantages to using an external inductor, including high sensitivity to noise and complexity of packaging.

It would be useful to have frequency synthesizers that are highly tunable. To achieve noise resistance and reduce packaging cost, it would be desirable to have frequency synthesizer designs with low phase noise and high Q oscillators that have on-chip inductors. Furthermore, it would also be desirable to be able to produce these frequency synthesizers using conventional integrated circuit manufacturing techniques.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved frequency synthesizer design is disclosed. The frequency synthesizer includes a fractional N PLL and a VCO that has a high Q. The inductors used in the VCO are on-chip. In one embodiment, the VCO includes multiple oscillator stages in a cascaded configuration. In one embodiment, the VCO includes multiple phase synchronous oscillator stages. In some embodiments, the VCO includes oscillator stages that are inductively coupled.

The high Q frequency synthesizer generated using the VCO with on-chip inductor enables the VCO to be used with wireless telephony standards that define frequency channels that are closely spaced, for example, GSM (including 850 MHz, 900 MHz, 1.8 GHz, 1.9 GHz bands), CDMA (including cellular 800 MHz band, K-PCS band, US PCS band), WCDMA, PHS and PDC. Previous on-chip inductor VCO designs have not been appropriate for use with closely spaced channels. In one embodiment, the VCO with an on-chip inductor is combined with a fractional N PLL and used to generate highly tunable oscillator frequencies suitable for use with the standards listed above. It should be noted that VCO's with on-chip inductor(s) according to the present invention may be used stand alone or included in frequency synthesizers.

Figure 2:
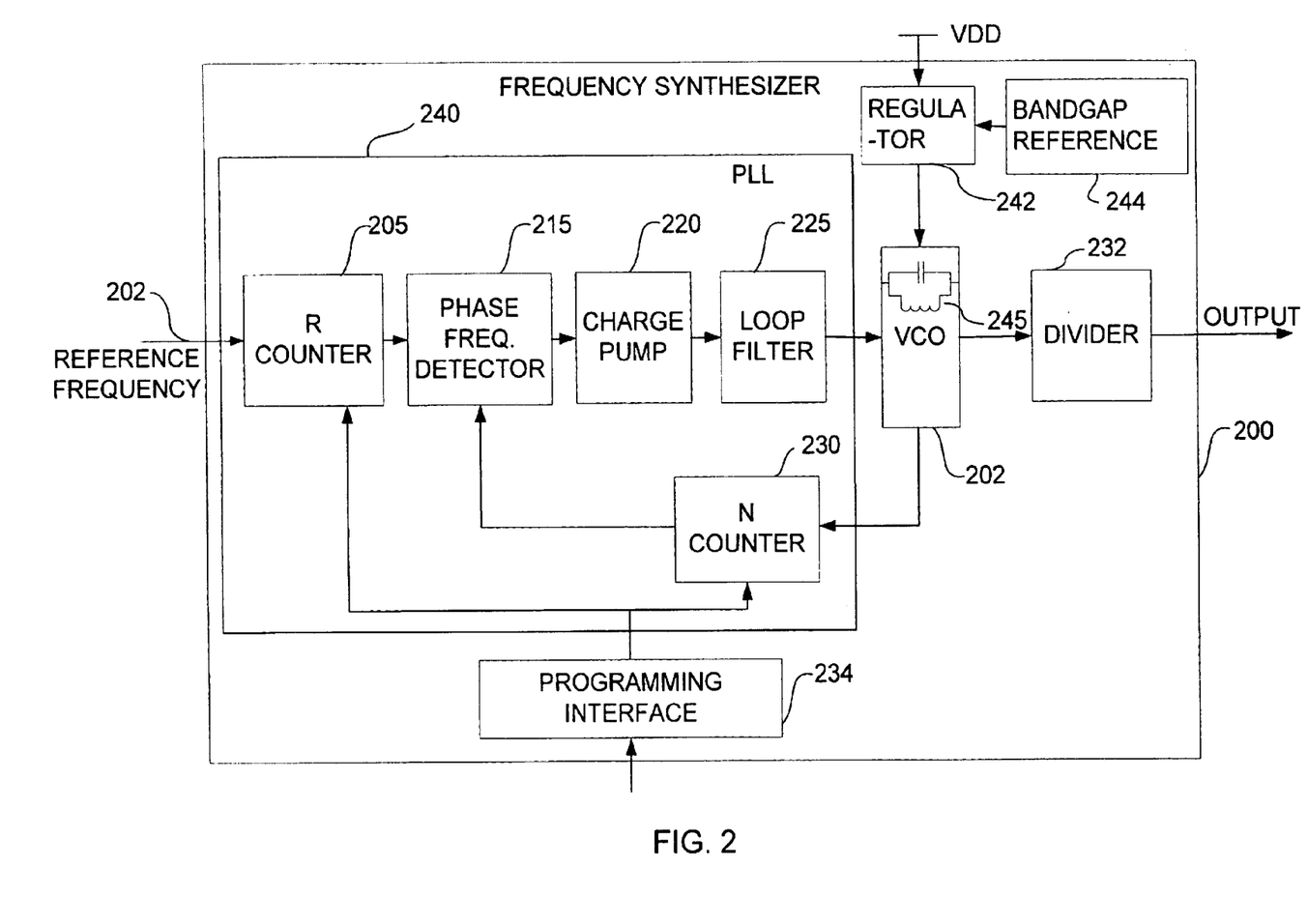
FIG. 2 is a block diagram illustrating a frequency synthesizer according to the present embodiment.

FIG. 2 is a block diagram illustrating a frequency synthesizer according to the present embodiment. The frequency synthesizer has a fractional N PLL and a VCO with an on-chip inductor. In one embodiment, the frequency synthesizer is built using CMOS technology. In another embodiment, the frequency synthesizer is built using SiGe technology.

Frequency synthesizer 200 has an input interface 202 used to receive a signal with a reference frequency. The reference frequency is divided by R counter 205 (also referred to as divider) of PLL 202. The successive stages of the PLL include phase frequency detector (PFD) 215, charge pump 220, and loop filter 225. The loop filters can be both on-chip or off chip. Loop filter 225 outputs a signal that is applied to VCO 240. VCO 240 outputs a synthesized signal, which is also fed back to N counter 230 to be divided and then applied to PFD 215. In this embodiment, a divider 232 is used to divide the VCO's output to generate an output signal at a desired frequency. The divider is configurable so that outputs of different frequencies can be produced. In other embodiments, the configurable divider is omitted.

The output frequency of VCO 240 is determined by R and N values based on a set of formulas. In a fractional N PLL configuration, the value for N may be a fractional value, used to more precisely tune the VCO output frequency. In the embodiment shown, there is a programming interface 234 that receives configuration parameters and configures the frequency synthesizer accordingly. The values of R and N are configured based on a set of configuration parameters received, using the techniques described in [bekap013]. In other embodiments, the values are configured using different techniques.

In the embodiment shown, the power supply of the VCO comes from an on-chip regulator 242, which controls the power input to the VCO based on the voltage of the power source VDD and a reference voltage generated by a bandgap reference 244. In some embodiments, programming interface 234 receives input parameters used to configure the regulator and control its power.

In the embodiment shown, VCO 240 has an on-chip inductor 245. Depending on the implementation of VCO 240, there can be more than one on-chip inductor. Various techniques are employed to implement a VCO with high Q using on-chip inductors that individually have low Q, [as described in bekap02, bekap07 and bekap11].

Figure 3:
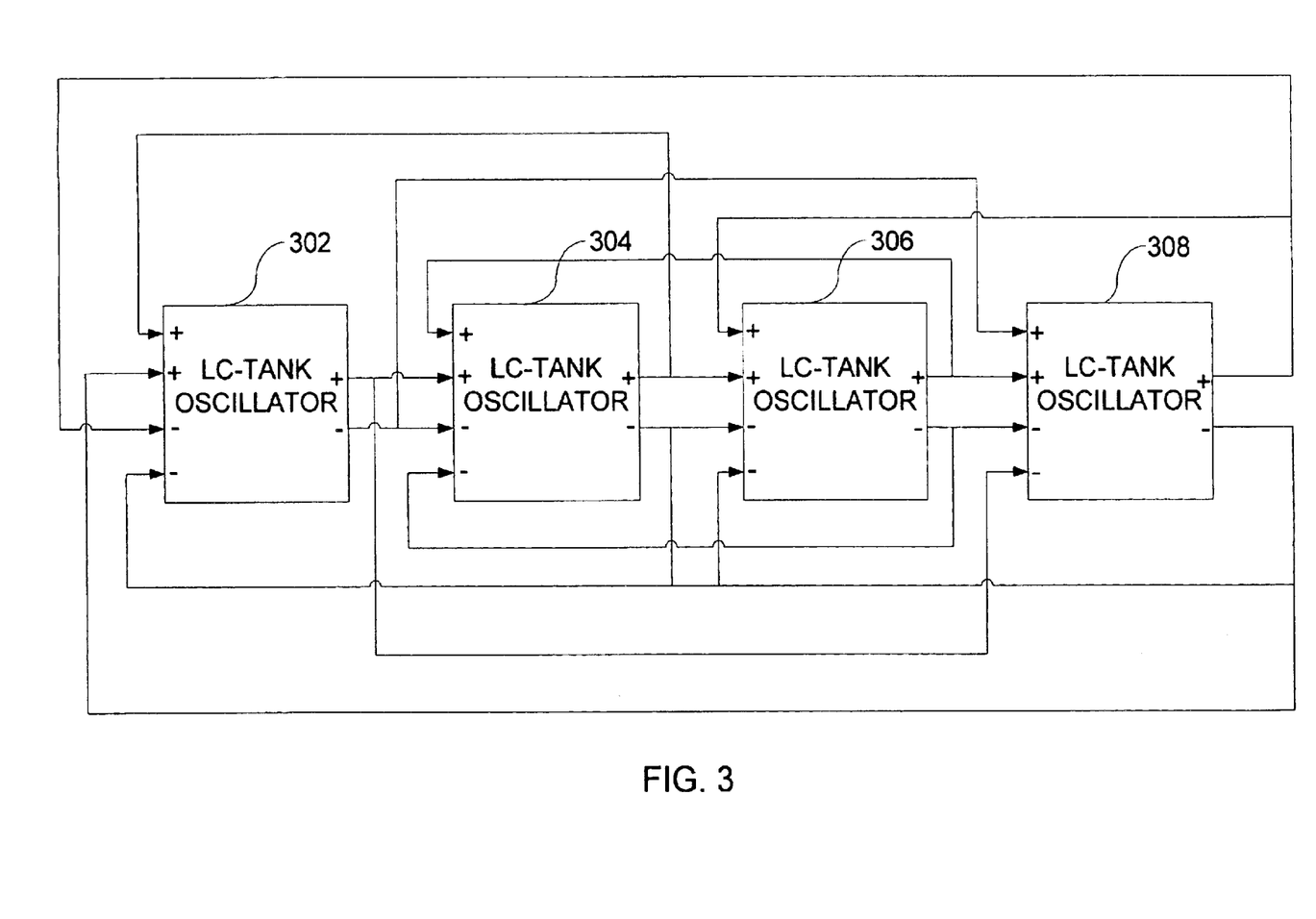
FIG. 3 is a block diagram illustrating a multiple stage cascaded LC tank VCO.

In one embodiment, a VCO uses multiple LC tanks that are cascaded based on certain phase relationship to increase the input signal power at each stage and achieve high Q. FIG. 3 is a block diagram illustrating a multiple stage cascaded LC tank VCO. In other embodiments, other types of oscillators are used and are connected in a similar manner as shown. In addition, it should be noted that each LC tank oscillator may be single ended. In the example shown, LC tank oscillators with two inputs are shown.

Oscillator stage 304 receives input from stage 302 that is positively fed forward, i.e., the positive output is fed to the positive input and the negative output is fed to the negative input. In addition, oscillator stage 304 also receives as an additional input the output signal from oscillator stage 306 which is positively fed back to oscillator stage 304. Similarly, oscillator stage 306 receives input fed forward from stage 304 and fed back positively from stage 308. The output of stage 308 is fed forward negatively to stage 302 with the positive output being input to the negative input and the negative output being input to the positive input. Stage 302 also receives input from the output of stage 304, which is fed back positively. The 45-degree phase difference between the two input signals to each stage of the four-stage amplifier causes the input power to be increased and enhances the amplitude of the output. An advantage of this phase arrangement is that the 45 degree added signal tends to grow faster than the orthogonally added noise that is introduced, which enhances the signal to noise ratio and improves the Q.

In other embodiments, different arrangements of the input and output connections are used. In some embodiments, the second input is obtained from a stage that is not immediately next to the stage that is receiving the input, i.e. stages may be skipped. In addition, different numbers of stages are used in other embodiments. The phase relationship among the inputs is arranged so that the input power is increased.

Figure 4:
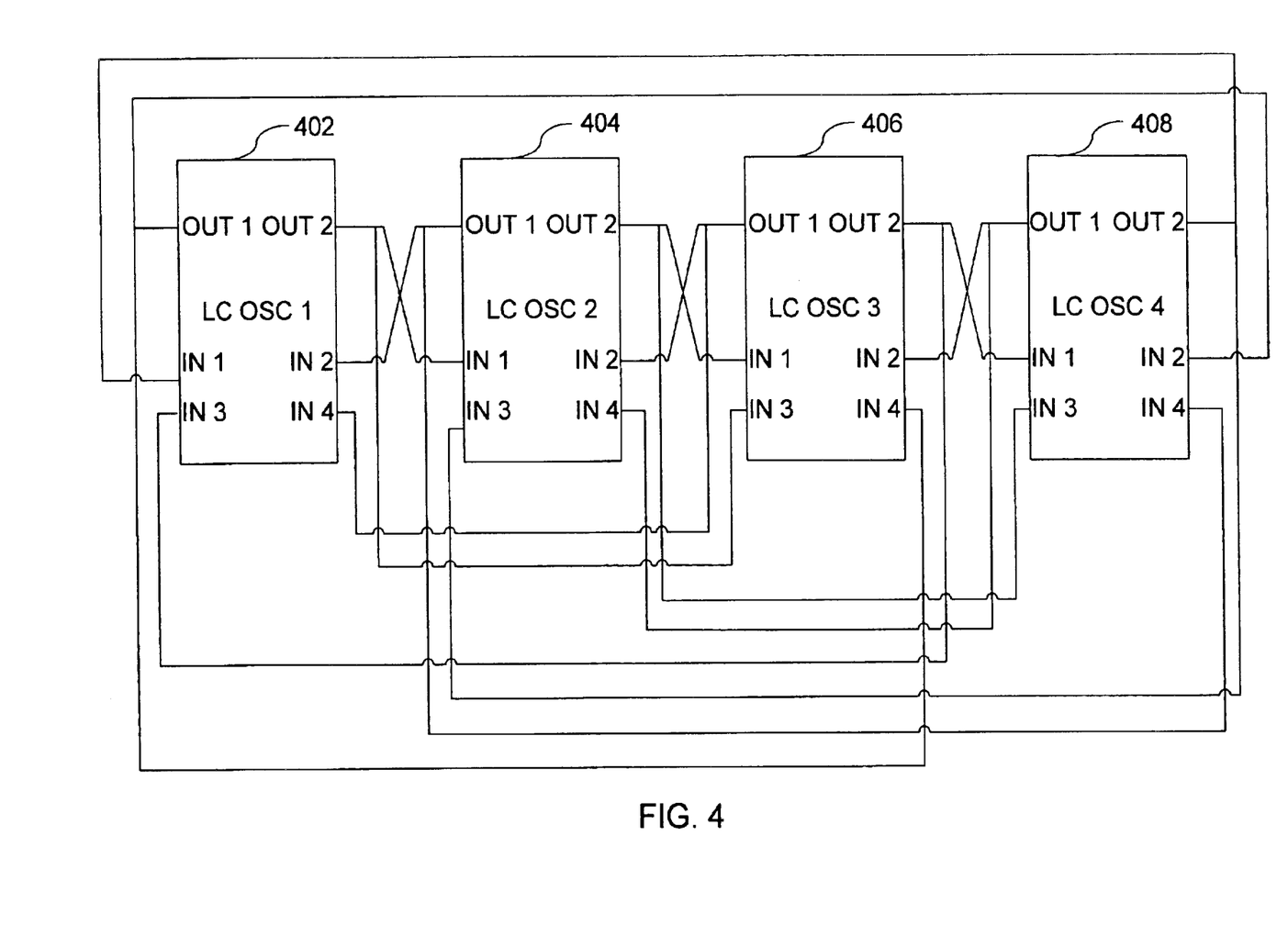
FIG. 4 is a block diagram illustrating an architecture used in one embodiment where synchronizing phase is achieved by having each oscillator stage receive an input from every other oscillator stage.

In one embodiment, multiple stages of LC tank oscillators are configured to oscillate synchronously, resulting in inductors that are mutually inductive. FIG. 4 is a block diagram illustrating an architecture used in one embodiment where synchronizing phase is achieved by having each oscillator stage receive an input from every other oscillator stage. The architecture includes four oscillator stages 402, 404, 406 and 408. Each oscillator includes four inputs and two outputs that are each split. Each oscillator stage outputs its own output signal to every other oscillator stage with one of the other oscillator stages receiving the output twice. For example, oscillator stage 404 includes a first output that is fed to an input of oscillator stage 402 and an input of oscillator stage 408. Oscillator stage 404 also includes a second output that is fed to two inputs of oscillator stage 406. As a result, all of the oscillators oscillate synchronously.

Figure 5:
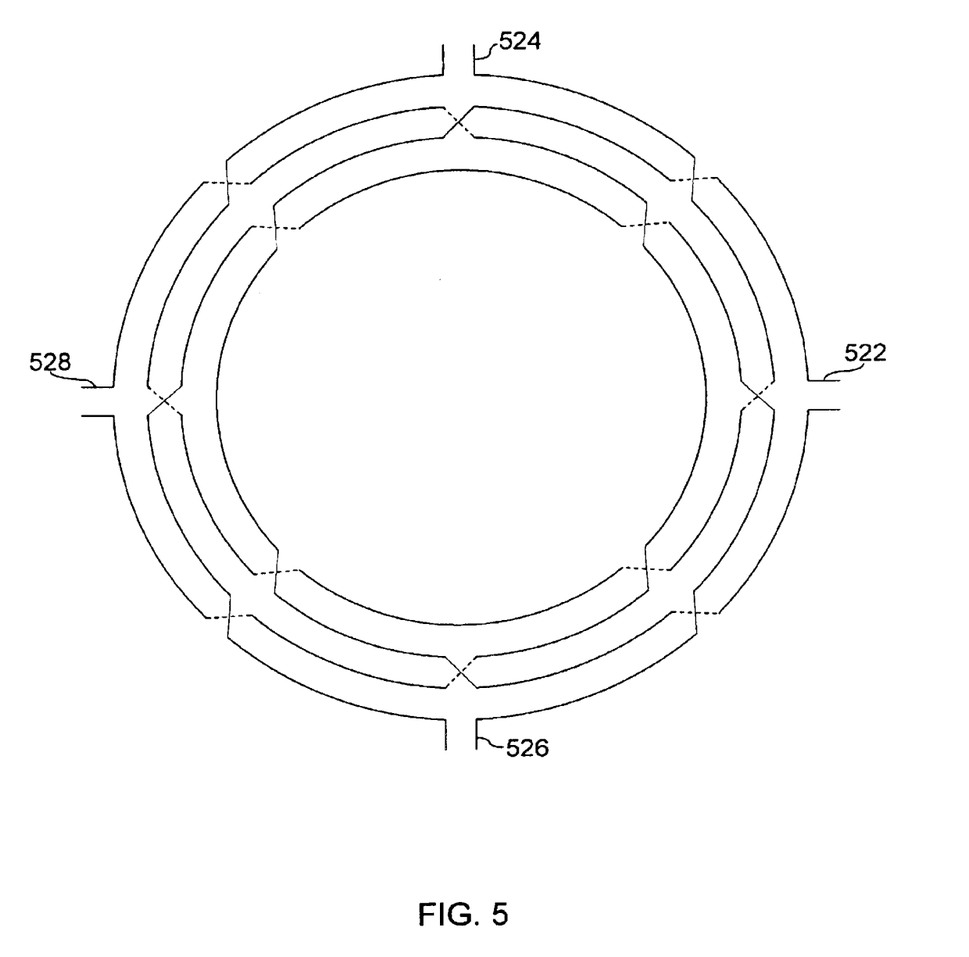
FIG. 5 is a diagram illustrating a high Q inductor comprising a circular layout with 4 inductors that are mutually inductive.

FIG. 5 is a diagram illustrating a high Q inductor comprising a circular layout with 4 inductors that are mutually inductive. The layout includes inductors 522, 524, 526 and 528. Each inductor is laid out so that the area in which its flux is contained substantially coexists with the flux area of the other inductors that comprise the other oscillators in the ring. The layout is symmetric and the flux area of the inductors substantially overlaps. Dashed lines are used to illustrate when one line passes under another line. This layout is implemented using a multilayer metal structure.

Figure 6:
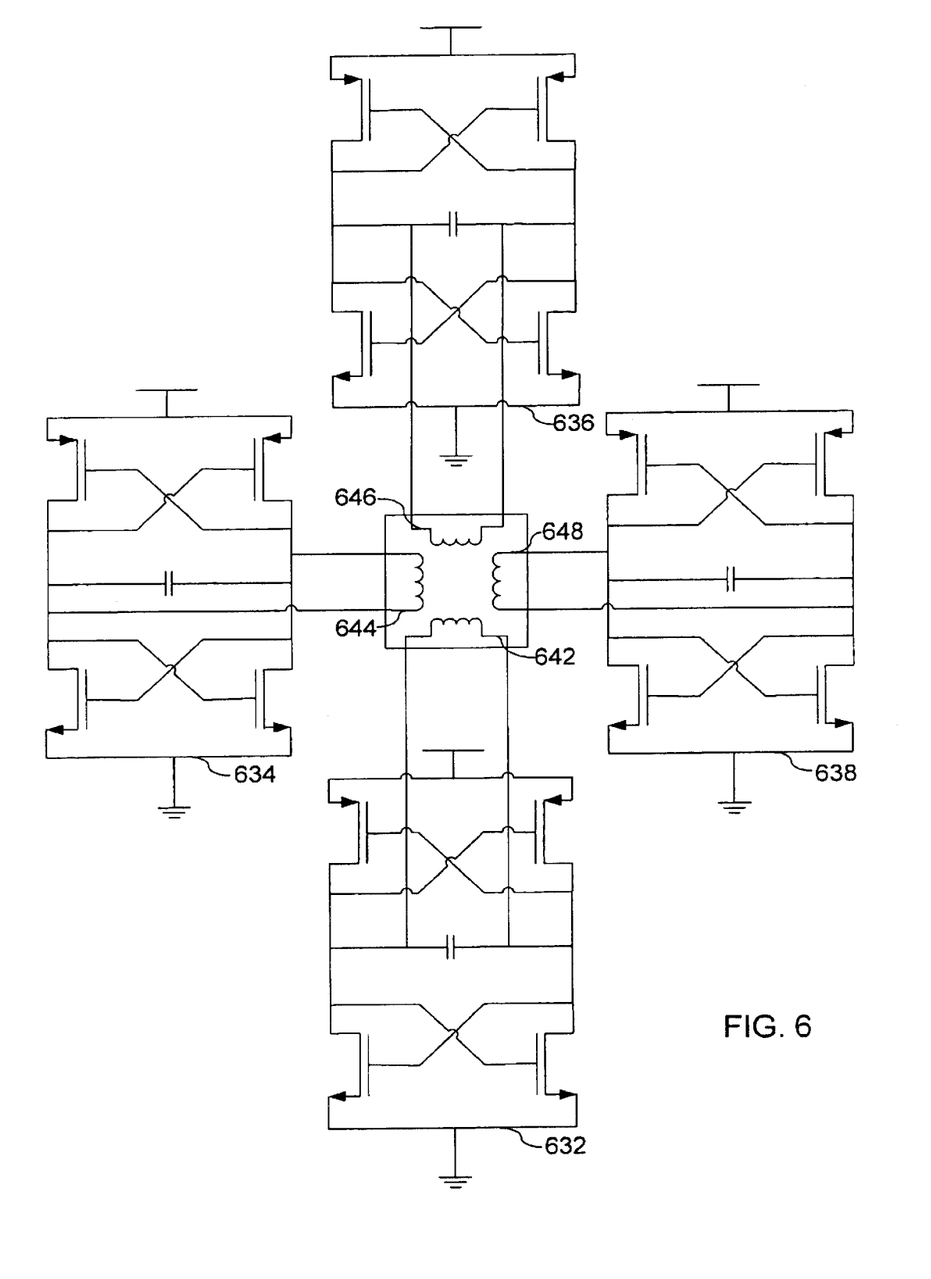
FIG. 6 is a diagram illustrating a 4 oscillator stage synchronous LC tank oscillator where the oscillators are inductively coupled without electrical coupling.

FIG. 6 is a diagram illustrating a 4 oscillator stage synchronous LC tank oscillator where the oscillators are inductively coupled without electrical coupling. Oscillators 632, 634, 636, and 638 are inductively coupled through their inductors 642, 644, 646, and 648. The inductors are disposed in a manner as shown in FIGS. 5 so that the areas in which flux is contained substantially overlap. The inductive coupling causes the oscillator stages to oscillate synchronously without electrical coupling. By replacing electrical coupling with inductive coupling, the noise associated with the electrical coupling circuit is eliminated.

Since the inductors used in the oscillator stages are on-chip, the outputs of the oscillator stages do not have to be in direct contact with connection pins external to the chip. Outputs of the oscillator stages that are sent to the outside of the chip, for instance the output of the last stage, are buffered and then sent to the outside of the chip. Not having direct contact with external connection pins reduces the VCO's sensitivity to noise and external electrical environment.

An improved frequency synthesizer has been disclosed. The frequency synthesizer includes a fractional N PLL and a high Q VCO with on-chip inductors. Various techniques are employed to produce a high Q VCO using multiple low Q oscillators with on-chip inductors, including cascading multiple oscillator stages, having multiple phase synchronous oscillator stages and inductively couple the oscillator stages. The resulting frequency synthesizer allows for precise tuning of the synthesized frequency, and are smaller and cheaper to produce compared to the conventional frequency synthesizer with off-chip inductors.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A frequency synthesizer for generating a synthesized signal comprising:
    an input interface configured to receive an input signal having a reference frequency;
    a phase locked loop (PLL) coupled to the input interface, having a fractional N configuration and comprises a voltage controlled oscillator;
    wherein:
    the voltage controlled oscillator is configured to generate the synthesized signal;
    the voltage controlled oscillator includes an on-chip inductor;
    the voltage controlled oscillator includes a plurality of stages;
    the plurality of stages are cascaded; and
    the plurality of stages are LC tank oscillators.

2. A frequency synthesizer as recited in claim 1 further comprising an output interface configured to send an output signal; wherein the output signal is the synthesized signal.

3. A frequency synthesizer as recited in claim 1 further comprising:
    an output interface configured to send an output signal;
    a divider coupled to the output interface, configured to divide the synthesized signal to generate the output signal.

4. A frequency synthesizer as recited in claim 1 wherein the frequency synthesizer has a quality factor (Q) that is suitable for cellular telephony standards that have multiple frequency channels.

5. A frequency synthesizer as recited in claim 1 wherein the frequency synthesizer has a quality factor (Q) that is suitable for cellular telephony standards that have multiple frequency channels; wherein the cellular telephony standards include GSM.

6. A frequency synthesizer as recited in claim 1 wherein the frequency synthesizer has a quality factor (Q) that is suitable for cellular telephony standards that have multiple frequency channels; wherein the cellular telephony standards include CDMA.

7. A frequency synthesizer as recited in claim 1 wherein the frequency synthesizer has a quality factor (Q) that is suitable for cellular telephony standards that have multiple frequency channels; wherein the cellular telephony standards include WCDMA.

8. A frequency synthesizer as recited in claim 1 wherein the frequency synthesizer has a quality factor (Q) that is suitable for cellular telephony standards that have multiple frequency channels; wherein the cellular telephony standards include PHS.

9. A frequency synthesizer as recited in claim 1 wherein the frequency synthesizer has a quality factor (Q) that is suitable for cellular telephony standards that have multiple frequency channels; wherein the cellular telephony standards include PDC.

10. A frequency synthesizer as recited in claim 1 wherein the frequency synthesizer is built using CMOS technology or SiGe technology.

11. A frequency synthesizer as recited in claim 1 wherein the voltage controlled oscillator includes a plurality of stages.

12. A frequency synthesizer as recited in claim 1 wherein the voltage controlled oscillator includes a plurality of stages and the plurality of stages are cascaded.

13. A frequency synthesizer as recited in claim 1 wherein:
    the voltage controlled oscillator includes a plurality of phase synchronous oscillator stages; and
    the plurality of phase synchronous oscillator stages are configured to oscillate synchronously with substantially similar phase.

14. A frequency synthesizer as recited in claim 1 wherein:
    the voltage controlled oscillator includes a plurality of phase synchronous oscillator stages;
    the plurality of phase synchronous oscillator stages are configured to oscillate synchronously with substantially similar phase; and
    the plurality of phase synchronous oscillator stages are inductively coupled.

15. A frequency synthesizer as recited in claim 1 further including a configurable divider for dividing the synthesized signal into different frequencies.

16. A frequency synthesizer, for generating a synthesized signal comprising:
    an input interface configured to receive an input signal having a reference frequency;
    a phase locked loop (PLL) coupled to the input interface, having a fractional N configuration and comprises a voltage controlled oscillator;

wherein:
the voltage controlled oscillator is configured to generate the synthesized signal;
the voltage controlled oscillator includes an on-chip inductor;
the voltage controlled oscillator includes a plurality of phase synchronous oscillator stages;
the plurality of phase synchronous oscillator stages are configured to oscillate synchronously with substantially similar phase; and
the plurality of phase synchronous oscillator stages are inductively coupled wherein the inductive coupling is achieved using inductors having areas in which flux is contained that substantially coexist.

17. A frequency synthesizer as recited in claim 1 wherein:
the frequency synthesizer is included in a frequency synthesizer chip; and
the voltage controlled oscillator includes an LC tank oscillator used to generate the synthesized frequency; wherein the LC tank oscillator resides on the frequency synthesizer chip.

18. A frequency synthesizer as recited in claim 1 wherein:
the frequency synthesizer is included in a frequency synthesizer chip; and
the voltage controlled oscillator includes an LC tank oscillator used to generate the synthesized frequency; wherein the LC tank oscillator reside on the frequency synthesizer chip and do not have direct contact with connection pins that are external to the frequency synthesizer chip.

19. A frequency synthesizer as recited in claim 1 further including an on-chip regulator for supplying power to the voltage controlled oscillator.

20. A frequency synthesizer as recited in claim 1 further including a programming interface for providing configuration parameters to the frequency synthesizer.

21. A frequency synthesizer for generating a synthesized signal, comprising:
an input interface configured to receive an input signal having a reference frequency;
a phase locked loop (PLL) coupled to the input interface, having a fractional N configuration and comprises a voltage controlled oscillator; and
a programming interface for providing configuration parameters to the frequency synthesizer; wherein:
the voltage controlled oscillator is configured to generate the synthesized signal;
the voltage controlled oscillator includes an on-chip inductor; and
the configuration parameters include parameters for configuring an output frequency of the frequency synthesizer and an output voltage of a regulator for supplying power to the voltage controlled oscillator.

22. A voltage controlled oscillator (VCO) for generating a synthesized al comprising:
a plurality of cascaded stages; and
an output interface coupled to the plurality of cascaded stages, configured to send an output signal;
wherein the plurality of cascaded stages includes a plurality of LC tank oscillators, and at least one of the plurality of LC tank oscillators includes an on-chip inductor.

23. A voltage controlled oscillator as recited in claim 22 herein the VCO is used in a CDMA transceiver.

* * * * *

UNITED STATES PATENT AND TRADEMARK OFFICE
CERTIFICATE OF CORRECTION

| | | |
|---|---|---|
| PATENT NO. | : 6,806,779 B1 | Page 1 of 1 |
| APPLICATION NO. | : 10/325478 | |
| DATED | : October 19, 2004 | |
| INVENTOR(S) | : Kim et al. | |

It is certified that error appears in the above-identified patent and that said Letters Patent is hereby corrected as shown below:

Column 3, line 39, change "202" to --240--.

Column 3, line 43, change "VCO 240." to --VCO 210.--.

Column 3, line 43, change "VCO 240 outputs" to --VCO 210 outputs--.

Column 3, line 50, change "240" to --210--.

Column 4, line 1, change "240" to --210--.

Column 4, line 3, change "240" to --210--.

Column 4, line 58, change "two inputs" to --an input--.

Column 4, line 59, after "406" please add --and stage 408--.

Column 5, Line 9, change "FIGS" to --FIG--.

Column 7, line 29, change "reside" to --resides--.

Column 7, line 30, change "do not" to --does not--.

Column 8, line 23, change "al" to --signal--.

Column 8, line 33, change "herein" to --wherein.--

Signed and Sealed this

Eighteenth Day of September, 2007

JON W. DUDAS
*Director of the United States Patent and Trademark Office*